(12) United States Patent
Liao et al.

(10) Patent No.: US 8,604,960 B2
(45) Date of Patent: Dec. 10, 2013

(54) OVERSAMPLED DATA PROCESSING CIRCUIT WITH MULTIPLE DETECTORS

(75) Inventors: Yu Liao, Longmont, CO (US); Nayak Ratnakar Aravind, Allentown, PA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/545,784

(22) Filed: Jul. 10, 2012

(65) Prior Publication Data

US 2013/0106637 A1 May 2, 2013

Related U.S. Application Data

(60) Provisional application No. 61/552,816, filed on Oct. 28, 2011.

(51) Int. Cl.
*H03M 1/12* (2006.01)

(52) U.S. Cl.
USPC .......................................... 341/155; 375/227

(58) Field of Classification Search
USPC ............ 341/155; 375/227, 233, 316, 32, 347, 375/349; 714/721, 776
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,796,777 A * | 8/1998 | Terlep et al. | 375/227 |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister | |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Joseph Lauture
(74) *Attorney, Agent, or Firm* — Hamilton DeSanctis & Cha

(57) ABSTRACT

Various embodiments of the present invention provide apparatuses and methods for processing data in an oversampled data processing circuit with multiple detectors. For example, an apparatus for processing data is disclosed that includes a first analog to digital converter operable to sample a continuous signal at a first sampling phase to yield a first digital output, a second analog to digital converter operable to sample the continuous signal at a second sampling phase to yield a second digital output, wherein the second sampling phase is different from the first sampling phase, a first detector operable to process the first digital output to yield a first detector output, and a second detector operable to process the second digital output and the first detector output to yield a detected output.

20 Claims, 3 Drawing Sheets

(56) References Cited

U.S. PATENT DOCUMENTS

| | | | |
|---|---|---|---|
| 6,023,783 | A | 2/2000 | Divsalar |
| 6,029,264 | A | 2/2000 | Kobayashi |
| 6,065,149 | A | 5/2000 | Yamanaka |
| 6,097,764 | A | 8/2000 | McCallister |
| 6,145,110 | A | 11/2000 | Khayrallah |
| 6,216,249 | B1 | 4/2001 | Bliss |
| 6,216,251 | B1 | 4/2001 | McGinn |
| 6,266,795 | B1 | 7/2001 | Wei |
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,248,630 | B2 | 7/2007 | Modrie |
| 7,257,764 | B2 | 8/2007 | Suzuki |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,421,017 | B2 | 9/2008 | Takatsu |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,705,761 | B2 | 4/2010 | Tietjen |
| 7,715,471 | B2 | 5/2010 | Werner |
| 7,752,523 | B1 | 7/2010 | Chaichanavong |
| 7,779,325 | B2 | 8/2010 | Song |
| 7,802,172 | B2 | 9/2010 | Vila Casado |
| 7,958,425 | B2 | 6/2011 | Chugg |
| 7,996,746 | B2 | 8/2011 | Livshitz |
| 8,018,360 | B2 | 9/2011 | Nayak |
| 8,046,666 | B2 | 10/2011 | Park et al. |
| 8,201,051 | B2 | 6/2012 | Tan |
| 8,208,213 | B2 | 6/2012 | Liu |
| 8,291,284 | B2 | 10/2012 | Savin |
| 2006/0123285 | A1 | 6/2006 | De Araujo |
| 2008/0069373 | A1 | 3/2008 | Jiang |
| 2008/0304558 | A1 | 12/2008 | Zhu et al. |
| 2009/0002862 | A1 | 1/2009 | Park et al. |
| 2009/0132893 | A1 | 5/2009 | Miyazaki |
| 2009/0185643 | A1 | 7/2009 | Fitzpatrick |
| 2011/0072335 | A1 | 3/2011 | Liu et al. |
| 2011/0075569 | A1 | 3/2011 | Marrow |
| 2011/0164332 | A1 | 7/2011 | Cao |
| 2011/0167227 | A1 | 7/2011 | Yang et al. |
| 2012/0019946 | A1 | 1/2012 | Aravind |
| 2012/0056612 | A1 | 3/2012 | Mathew |
| 2012/0069891 | A1 | 3/2012 | Zhang |
| 2012/0124119 | A1 | 5/2012 | Yang |
| 2012/0236430 | A1 | 9/2012 | Tan |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of $Gf(2^m)$ LDPC Decoders", IEEE Transactions on Circuits and Systemsši: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/239,719, Unpublished (filed Sep. 22, 2011) (Haitao Xia).

U.S. Appl. No. 13/525,182, Unpublished (filed Jun. 15, 2012) (Yang Han).

U.S. Appl. No. 13/525,188, Unpublished (filed Jun. 15, 2012) (Yang Han).

U.S. Appl. No. 13/174,273, Unpublished (filed Jun. 30, 2011) (Yu Liao).

U.S. Appl. No. 13/272,209, Unpublished (filed Oct. 12, 2011) (Yu Liao).

(56) References Cited

OTHER PUBLICATIONS

U.S. Appl. No. 13/346,556, Unpublished (filed Jan. 9, 2012) (Haitao Xia).
U.S. Appl. No. 13/491,062, Unpublished (filed Jun. 7, 2012) (Jin Lu).
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-55, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Design of VLSI Implementation-Oriented LDPC Codes", IEEE, pp. 670-673, 2003.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong et al., "Joint Code-Encoder Design for LDPC Coding System VLSI Implementation", ISCAS, IEEE pp. 389-392, May 2004.
Zhong et al., "High-Rate Quasi-Cyclic LDPC Codes for Magnetic Recording Channel with Low Error Floor", ISCAS, IEEE pp. 3546-3549, May 2006.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

OVERSAMPLED DATA PROCESSING CIRCUIT WITH MULTIPLE DETECTORS

CROSS REFERENCE TO RELATED APPLICATIONS

The present application claims priority to (is a non-provisional of) U.S. Pat. App. No. 61/552,816, entitled "Oversampled Data Processing Circuit With Multiple Detectors", and filed Oct. 28, 2011 by Liao et al, the entirety of which is incorporated herein by reference for all purposes.

BACKGROUND

Various products including hard disk drives utilize a read channel device to retrieve information from a medium and decode and convert the information to a digital data format. Such read channel devices may include data processing circuits including an analog to digital converter along with a data detector circuit. The ability to detect the original stored data patterns in the received data samples from the analog to digital converter is important to the accurate transfer of data.

In a conventional oversampled data processing circuit, a continuous analog signal is sampled in the analog to digital converter at a rate greater than or equal to twice the baud rate. The resulting samples are low pass filtered and decimated to form a baud rate sequence. However, there is typically no significant bit error rate performance improvement between the conventional oversampled data processing circuit and a non-oversampled system or baud rate system.

The push toward low-cost, high-performance data transfer systems is resulting in tight constraints on latency and power dissipation of the read channel circuits. At the same time, there is a corresponding push to transfer higher density data patterns. This often requires detection of transferred data in a reduced signal to noise ratio environment. In this environment, current data processing circuits may not offer sufficient speed or accuracy.

Thus, for at least the aforementioned reason, there exists a need in the art for improving data detection in data processing circuits.

BRIEF SUMMARY

Various embodiments of the present invention provide apparatuses and methods for processing data in an oversampled data processing circuit with multiple detectors. For example, an apparatus for processing data is disclosed that includes a first analog to digital converter operable to sample a continuous signal at a first sampling phase to yield a first digital output, a second analog to digital converter operable to sample the continuous signal at a second sampling phase to yield a second digital output, wherein the second sampling phase is different from the first sampling phase, a first detector operable to process the first digital output to yield a first detector output, and a second detector operable to process the second digital output and the first detector output to yield a detected output. The first and second analog to digital converters are operable in some embodiments to oversample the continuous signal at a rate at least twice that of a baud rate of the continuous signal. In some embodiments of the apparatus, the first detector and/or the second detector are detectors that generate soft information of the data bits, such as likelihood ratio or a priori probability ratio. In some instances, the first detector output comprises log likelihood ratio values for the data bits. In such embodiments, the second detector adds the log likelihood ratio values to branch metric values computed in the second detector based on the second digital output. The second detector may further be operable to multiply the log likelihood ratio values by a sign of each data bit corresponding to the log likelihood ratio values before adding the log likelihood ratio values to the branch metric values. Some instances of the apparatus include a scaling circuit operable to scale the first detector output before it is processed by the second detector.

In some instances of the aforementioned embodiments, the apparatus includes a first digital finite impulse response filter connected between the first analog to digital converter and the first detector, operable to equalize the first digital output, and a second digital finite impulse response filter connected between the second analog to digital converter and the second detector, operable to equalize the second digital output.

In some instances of the aforementioned embodiments, the apparatus includes digital finite impulse response filters between the analog to digital converters and the detectors. The apparatus may also include low pass filters between the analog to digital converters and the detectors. Some instances also include an analog front end operable to process the continuous signal before it is sampled by the first analog to digital converter and the second analog to digital converter.

Other embodiments of the present invention provide methods for processing data in a data processing circuit a signal, including sampling an analog signal in a first analog to digital converter with a first sampling phase to yield a first baud rate stream, sampling the analog signal in a second analog to digital converter with a second sampling phase to yield a second baud rate stream, processing the first baud rate stream in a detector to yield log likelihood ratio values for the first baud rate stream, and combining values derived from the log likelihood ratio values with branch metrics in a second detector to yield a detected output.

In some instances, the method also includes scaling the log likelihood ratio values and multiplying the log likelihood ratio values by data bit signs to yield the values derived from the log likelihood ratio values.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Various embodiments of the present invention provide apparatuses and methods for processing data in an oversampled data processing circuit with multiple detectors. The oversampled data processing circuit with multiple detectors (also referred to below as a data processing circuit) utilizes the time diversity in an oversampled system to achieve better data detection than baud rate systems and conventional oversampled systems. Incoming analog signals are divided into multiple streams which are oversampled with different sampling phases to yield multiple baud rate streams. The oversampled data processing circuit may use baud rate streams with any number of bits per symbol. For example, some embodiments may use a two-bit symbol with four states, 00, 01, 10 and 11. Multiple analog to digital converters biased at different phases introduce time diversity into the baud rate streams. The baud rate streams from analog to digital converters with different phases have different noise components, which are each processed with equalization and noise-predictive maximum likelihood (NPML) detection in a different data detector. During the NPML detection, at least one of the baud rate streams uses the log likelihood ratio (LLR) from one or more other baud rate streams with different phases as a priori LLRs in branch metric computations. The LLR of a data bit $a_k$ is given by the logarithm of the probability that bit $a_k$ equals 1 divided by the probability that bit $a_k$ is zero:

$$LLR(a_k) = \log\left(\frac{Pr(a_k = 1)}{Pr(a_k = 0)}\right) \qquad \text{Equation 1}$$

In some embodiments such as a read channel device for a magnetic hard disk drive, the analog signals are oversampled at twice the baud rate. In embodiments other oversampling rates are used. The oversampled data processing circuit with multiple detectors is not limited to any particular oversampling rate.

Figure 1:
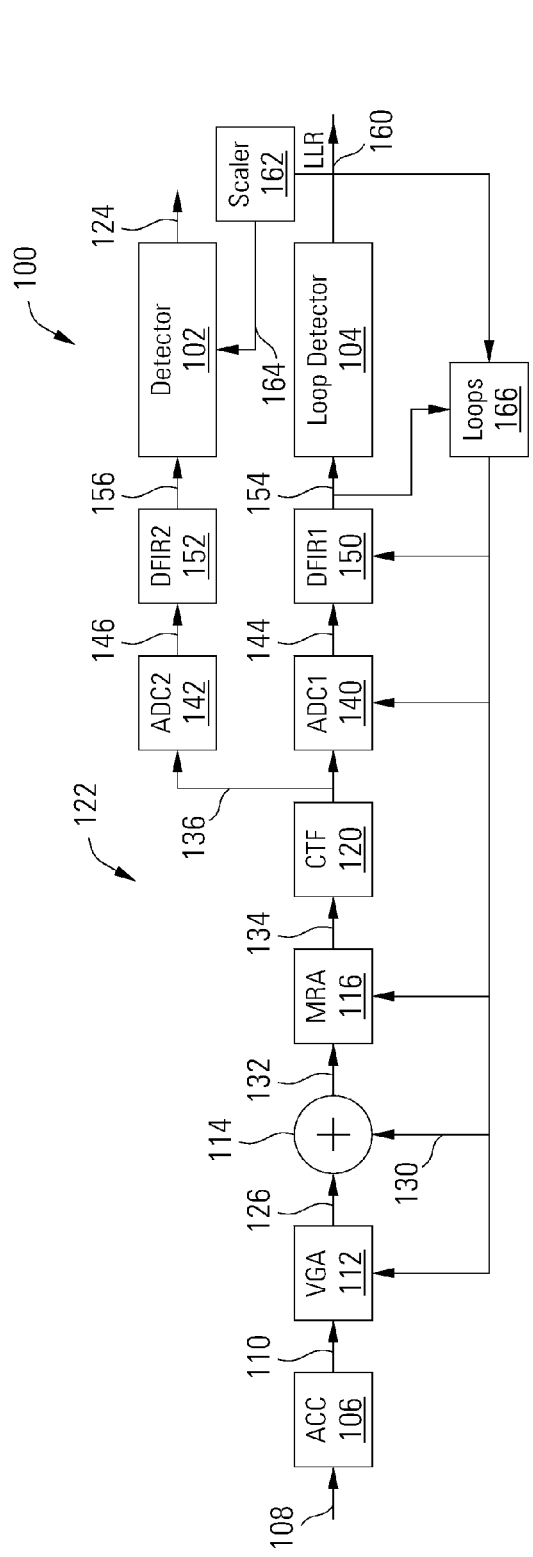
FIG. 1 depicts a data processing circuit with multiple detectors in accordance with some embodiments of the present invention.

Turning to FIG. 1, a data processing circuit 100 including multiple detectors 102 and 104 is shown in accordance with one or more embodiments of the present invention. Detectors 102 and 104 may be any detectors that generate soft information of the data bits, such as likelihood ratio or a priori probability ratio. Data processing circuit 100 includes an AC coupled amplifier 106 that receives a data input 108 and yields a signal 110 in which any DC bias in the data input 108 is reduced. Data input 108 is an analog data input that presents serial information to AC coupled amplifier 106. Data input 108 may be derived, for example, from a magnetic storage medium using a magnetic read head, or from a transmission device using a receiver. Based upon the disclosure provided herein, one of ordinary skill in the art will recognize a variety of sources from which data input 108 may be derived.

The signal 110 from the AC coupled amplifier 106 may be processed in a series of analog front end devices as is known, such as a variable gain amplifier 112, baseline correction circuit 114, magnetic response asymmetric correction circuit 116, and continuous-time filter 120. Based upon the disclosure provided herein, one of ordinary skill in the art will recognize a variety of components that may be included in the analog front end 122 to process the data input 108, based upon the particular storage or transmission technology from which the data input 108 is derived. In the example embodiment illustrated in FIG. 1, which may be adapted for use in a read channel for a magnetic medium, the analog front end 122 functions in general to attenuate DC components in the data input 108, amplify and adjust the resulting AC signal for asymmetrical characteristics of the magnetic read head, filter and digitize the signal, and perform a feedback DC restoration, effectively adding the missing DC signal to the DC-free pre-equalized signal so that the detectors may ignore the presence of high pass filters in the analog front end 122 of the read channel.

In the embodiment illustrated in FIG. 1, the AC coupled amplifier 106 acts as a high pass filter to attenuate the DC components in the data input 108. The variable gain amplifier 112 adjusts the amplitude of the signal 110 from the AC coupled amplifier 106 in order to improve detection and reduce bit errors in a detected output 124. Baseline correction circuit 114 performs a feedback DC restoration, summing the amplified signal 126 from the variable gain amplifier 112 with a feedback signal 130 that effectively restores the missing DC components. The magnetic response asymmetric correction circuit 116 processes the combined signal 132 from the baseline correction circuit 114 to provide compensation for a magneto-resistive asymmetry (MRA) characteristic of the magnetic read head which reads the data input 108 from a magnetic medium. In some embodiments, the magnetic response asymmetric correction circuit 116 may implement a quadratic MRA (QMRA) compensation. The continuous-time filter 120 processes the output 134 of the magnetic response asymmetric correction circuit 116, providing waveform smoothing and phase equalization of the read channel signal. Again, the analog front end 122 is not limited to the example components (e.g., 106, 112, 114, 116, 120) disclosed herein and illustrated in FIG. 1, nor are the components of the analog front end 122 limited to the sequence shown.

The analog signal 136 produced by analog front end 122 based on data input 108 is sampled by at least two analog to digital converters 140 and 142, each sampling the analog signal 136 with a different sampling phase to introduce time diversity to the data processing circuit 100, yielding baud rate streams 144 and 146 having different noise components. Analog to digital converters 140 and 142 may be any type of analog to digital converter known in the art.

Baud rate streams 144 and 146 are provided to digital finite impulse response (DFIR) filters 150 and 152, respectively, which act as equalizers on the digital samples from the analog to digital converters 140 and 142, compensating for inter-symbol interference (ISI) resulting from data being transmitted at high speed through band-limited channels and yielding filtered digital streams 154 and 156.

Filtered digital stream 154 is provided to loop detector 104, which may be any data detector that provides log likelihood ratios at an LLR output 160, or any other type of detector output that may be used in the decoding calculations of detector 102. In some embodiments, for example, loop detector 104 is a maximum likelihood sequence detector or a maximum a posteriori (MAP) detector, a trellis-based detector which can be represented by a trellis diagram of states interconnected by branches. A transition between one set of state metrics at time k and the next at time k+1 represents a data bit received at the decoder input. Each transition from a given state time k has a number of possible branches to states at the next time k+1. During decoding, branch metrics are calculated for each path through the trellis, giving the likelihood that the received data bits have the values corresponding to that path, using any of a number of suitable branch metric algorithms currently known or developed in the future. Each branch in the trellis has several bits $a_k a_{k-1} \ldots a_{k-\Delta}$ associated with it, and the branch metric is given by:

$$BM(a_k a_{k-1} \ldots a_{k-\Delta}) = \log Pr(y_k | a_k a_{k-1} \ldots a_{k-\Delta}) \quad \text{Equation 2}$$

where $BM(a_k a_{k-1} \ldots a_{k-\Delta})$ is the branch metric associated with bits $a_k a_{k-1} \ldots a_{k-\Delta}$ and $y_k$ is the sample processed by loop detector 104 at time k.

Again, the loop detector 104 in the data processing circuit is not limited to any particular type of decoder. The log likelihood ratios at LLR output 160 may thus be calculated from the branch metrics in any suitable manner, whether currently known as implemented in any of a number of trellis-based detectors or developed in the future. The LLR output 160 from loop detector 104 provides the log likelihood ratio $LLR(a_k)$ for each data bit $a_k$, as well as the sign $sgn(a_k)$ of each data bit:

$$sgn(a_k) = \begin{cases} 1, & \text{if } a_k = 1 \\ -1, & \text{if } a_k = 0 \end{cases} \quad \text{Equation 3}$$

Filtered digital stream 156 is provided to detector 102, which may also be a maximum likelihood sequence detector or a maximum a posteriori (MAP) detector. Detectors 102 and 104 may be the same or different types of detectors. In some embodiments, the LLR output 160 from loop detector 104 is scaled in a scaler 162 before they are provided to detector 102 for use in calculating branch metrics. Scaler 162 is operable to apply a programmable scaling factor from 0 to 1 to the LLR values, for example in steps of ⅛. The scaling factor applied by scaler 162 in some embodiments is dependent on the magnitude of the soft data, for example being initialized at ½ and being adjusted up or down based on the magnitude of the soft data to increase data detection in detector 102.

The scaled LLR values 164 are provided by scaler 162 to detector 102 for use by detector 102 in calculating branch metrics. For example, detector 102 may combine the scaled LLR values 164 with existing branch metric calculations as follows:

$$BM(a_k a_{k-1} \ldots a_{k-\Delta}) = \log Pr(y_k | a_k a_{k-1} \ldots a_{k-\Delta}) + sgn(a_k) \cdot \frac{LLR(a_k)}{2} \quad \text{Equation 4}$$

Thus, the branch metric calculation for sample $y_k$ is multiplied (added in the log domain) by the scaled $LLR(a_k)$ value for bit $a_k$ from LLR values 164, multiplied by the sign $sgn(a_k)$ of the bit $a_k$. The $LLR(a_k)$ value for bit $a_k$ may be divided by 2 or other values in the detector 102 to further scale and moderate the effect of the LLR output 160 from loop detector 104 on the branch metric calculations in detector 102. In some embodiments, the $sgn(a_k)$ of the bit $a_k$ is determined in loop detector 104. In other embodiments, the $sgn(a_k)$ of the bit $a_k$ is determined in detector 102. The LLR values from loop detector 104 are thus added to the metrics for each branch in detector 102 to form trellis branch metrics, altering the magnitude of each metric and thus the likelihood of the values of the detected bits. The detected output 124 is then calculated based on the trellis branch metrics, again using any suitable technique now known or developed in the future for making final decisions about bit values based on branch metrics.

By including LLR values from loop detector 104 in the branch metric calculations of detector 102, data detection in detector 102 is improved, reducing the bit error rate in detected output 124 from detector 102 due to the time diversity in the baud rate streams 144 and 146.

The filtered digital stream 154 and LLR output 160 may also be used in feedback loops 166, providing signals (e.g., 130) used to set the gain of variable gain amplifier 112, restore missing DC components in baseline correction circuit 114, and adjust the operation of magnetic response asymmetric correction circuit 116, analog to digital converter 140, and DFIR filter 150.

Figure 2:
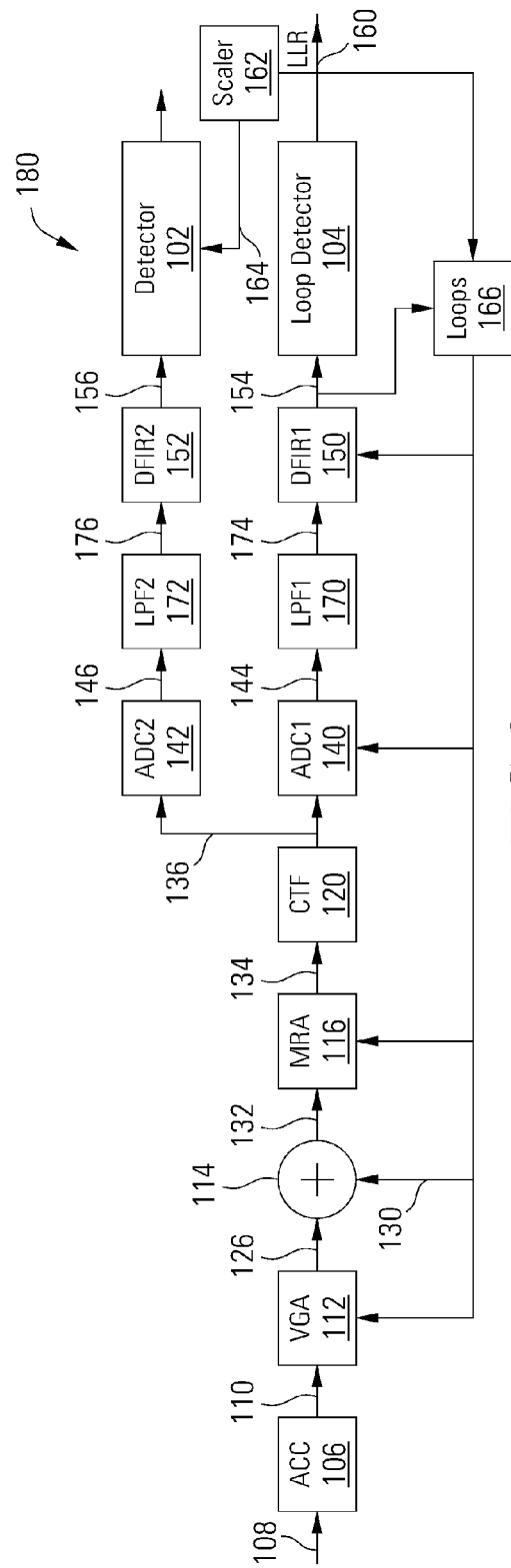
FIG. 2 depicts a processing circuit with low pass filtered digital samples provided to multiple detectors in accordance with some embodiments of the present invention.

Turning to FIG. 2, in another embodiment of a data processing circuit 180 the baud rate streams 144 and 146 from analog to digital converters 140 and 142 are filtered in low pass filters 170 and 172, respectively. The resulting filtered baud rate streams 174 and 176 are provided to DFIR filters 150 and 152 and processed as disclosed above with respect to FIG. 1. In some embodiments, baud rate streams 144 and 146 may be filtered in a single low pass filter circuit.

Figure 3:
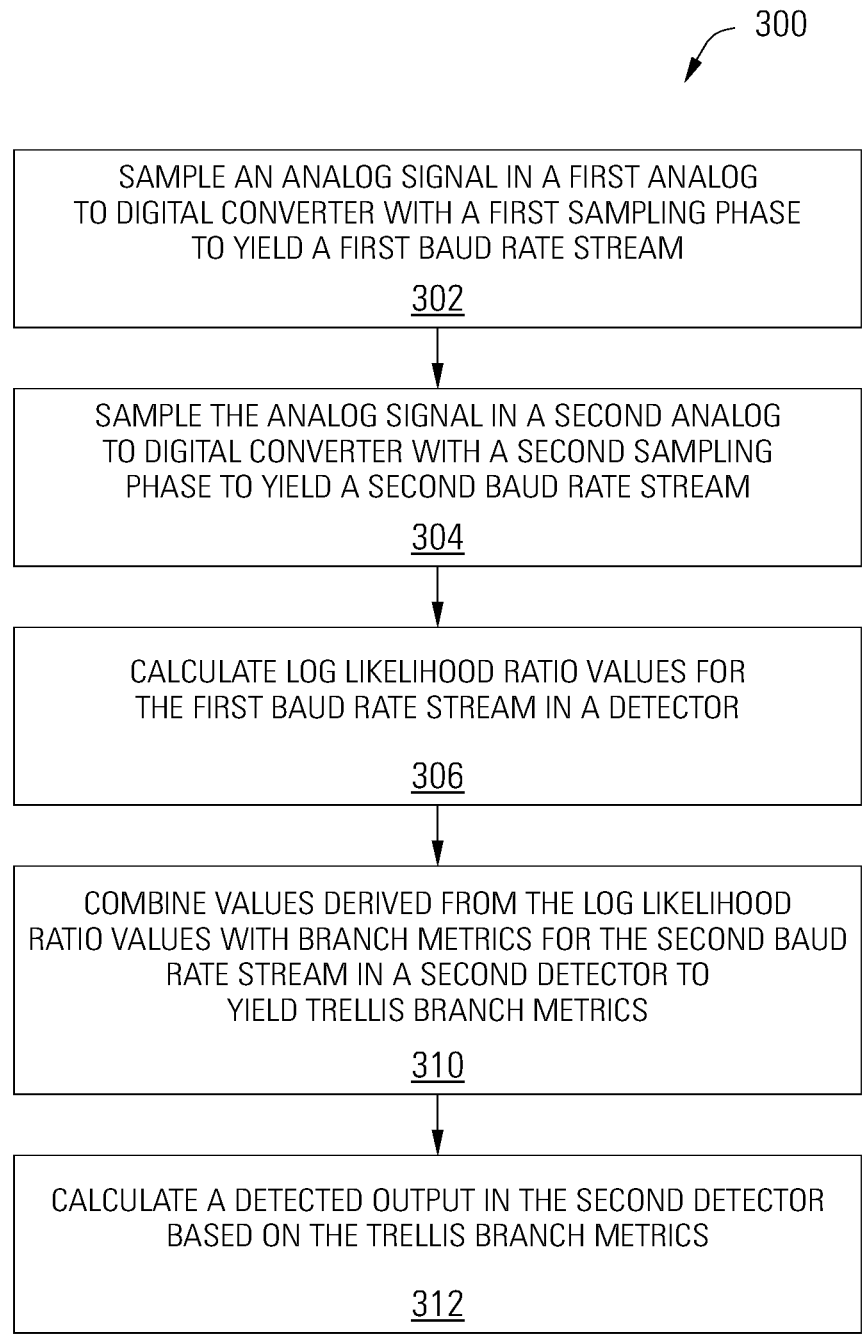
FIG. 3 is a flow diagram illustrating a method for processing data in an oversampled data processing circuit with multiple detectors in accordance with some embodiments of the present invention.

Turning to FIG. 3, a flow diagram 300 shows a method for processing data in an oversampled data processing circuit with multiple detectors in accordance with some embodiments of the present invention. Following flow diagram 300, an analog signal is sampled in a first analog to digital converter with a first sampling phase to yield a first baud rate stream. (Block 302) The analog signal may be derived from any source such as a storage device or a transmission system. In some embodiments, the analog signal is read from a magnetic hard disk drive using a magnetic read head, and the method of FIG. 3 is implemented in a read channel circuit. The analog signal is also sampled in a second analog to digital converter with a second sampling phase to yield a second baud rate stream. (Block 304) In some embodiments, the first and second analog to digital converters oversample the analog signal, for example at twice the baud rate or more. In some embodiments, the first and second analog to digital converters sample the analog signal at the same frequency but with different sampling phases, introducing time diversity and thus different noise components into the first and second baud rate streams. The sampling phase difference between the first and second analog to digital converters is not limited to any particular offset. In some embodiments, the sampling phase is evenly spaced between the first and second analog to digital converters, with one leading the other by half a clock cycle. Either the first or second analog to digital converters may be in advance of the other.

A detector is used to calculate log likelihood ratio values for the first baud rate stream. (Block 306) Any of a number of suitable detector types may be used to process the first baud rate stream, such as a trellis-based maximum likelihood sequence detector. Values derived from the log likelihood ratio values for the first baud rate stream are combined with branch metrics for the second baud rate stream in a second detector to yield time diverse branch metrics. (Block 310) Thus, at least two baud rate streams are formed with different sampling phases from the analog signal to introduce time diversity, and each baud rate stream is processed in a data detector to make decisions about the value of symbols in the baud rate streams. The first detector generates log likelihood ratio values that are combined with branch metric values in the second detector to improve detection in the second detector. A detected output is calculated in the second detector based on the time diverse branch metrics. (Block 312)

The values to be combined with the branch metrics in the second detector may be derived from the log likelihood ratio values from the first detector either directly, without modification, or by further processing or converting the log likelihood ratio values. For example, some embodiments of the method also include scaling the log likelihood ratio values from the first detector before combining them with branch metrics for the second baud rate stream in the second detector. In some embodiments, the log likelihood ratio values may be converted to or from other formats, based on the design of the first and second detectors.

In some embodiments, more than two baud rate streams are formed, each by an analog to digital converter having a unique sampling phase. The first detector of block 302 is replaced by any number of detectors, each processing one of the baud rate streams and producing their own log likelihood ratio values and further increasing the time diversity in the baud rate streams. In these embodiments, the scaling of the log likelihood ratio values may be related to the number of detectors used in place of the first detector of block 302.

Some embodiments of the method also include equalizing the baud rate streams in digital finite impulse response filters, compensating for inter-symbol interference, before performing the detecting processes of blocks 306 and 310. In some instances of the aforementioned embodiments, the baud rate streams are also passed through low pass filters before detection.

Various embodiments of the method also include processing the analog signal in an analog front end, including one or more processes such as AC coupling the analog signal to the data processing circuit, amplifying the AC coupled analog signal in a variable gain amplifier, performing feedback DC restoration in a baseline correction circuit, compensating for magneto-resistive asymmetry of the magnetic read head in a magnetic response asymmetric correction circuit, and performing waveform smoothing and phase equalization in a continuous-time filter.

Figure 4:
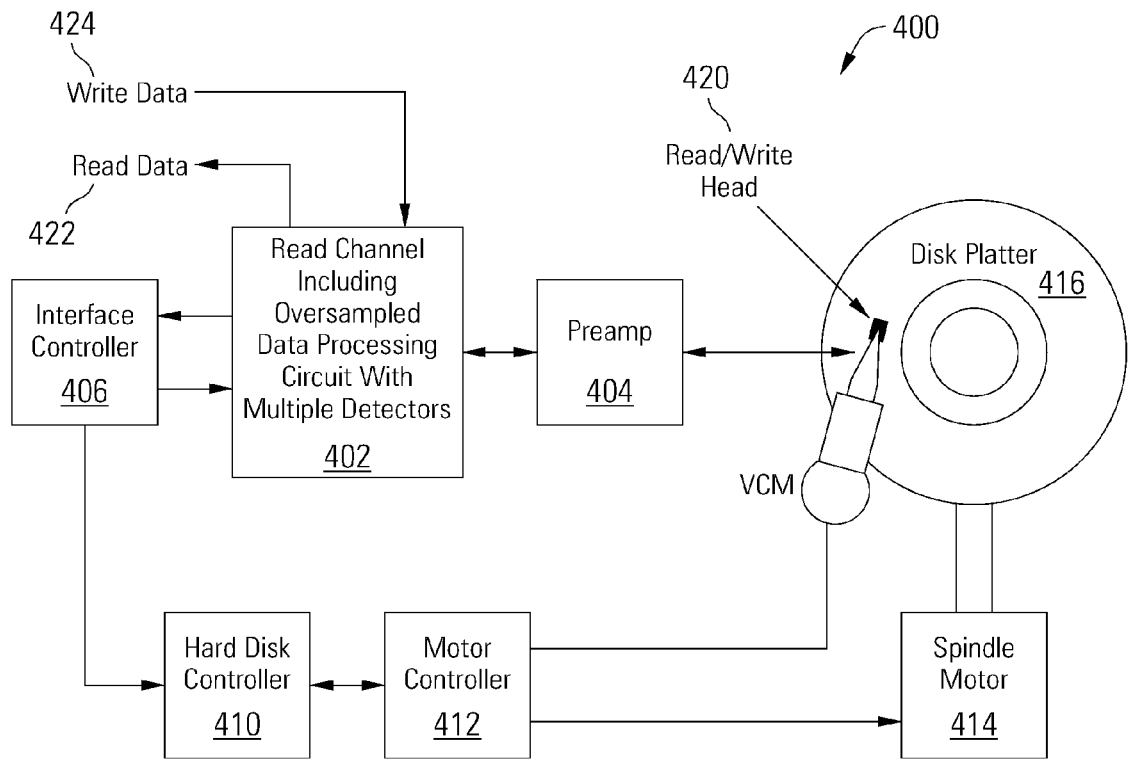
FIG. 4 depicts a storage system including an oversampled data processing circuit with multiple detectors in accordance with some embodiments of the present invention.

Turning to FIG. 4, a storage system 400 is illustrated as an example application of an oversampled data processing circuit with multiple detectors in accordance with some embodiments of the present invention. However, it is important to note that the oversampled data processing circuit with multiple detectors disclosed herein is not limited to any particular application such as the storage system 400 of FIG. 4. The storage system 400 includes a read channel circuit 402 with an oversampled data processing circuit with multiple detectors in accordance with some embodiments of the present invention. Storage system 400 may be, for example, a hard disk drive. Storage system 400 also includes a preamplifier 404, an interface controller 406, a hard disk controller 410, a motor controller 412, a spindle motor 414, a disk platter 416, and a read/write head assembly 420. Interface controller 406 controls addressing and timing of data to/from disk platter 416. The data on disk platter 416 consists of groups of magnetic signals that may be detected by read/write head assembly 420 when the assembly is properly positioned over disk platter 416. In one embodiment, disk platter 416 includes magnetic signals recorded in accordance with either a longitudinal or a perpendicular recording scheme.

In a typical read operation, read/write head assembly 420 is accurately positioned by motor controller 412 over a desired data track on disk platter 416. Motor controller 412 both positions read/write head assembly 420 in relation to disk platter 416 and drives spindle motor 414 by moving read/write head assembly 420 to the proper data track on disk platter 416 under the direction of hard disk controller 410. Spindle motor 414 spins disk platter 416 at a determined spin rate (RPMs). Once read/write head assembly 420 is positioned adjacent the proper data track, magnetic signals representing data on disk platter 416 are sensed by read/write head assembly 420 as disk platter 416 is rotated by spindle motor 414. The sensed magnetic signals are provided as a continuous, minute analog signal representative of the magnetic data on disk platter 416. This minute analog signal is transferred from read/write head assembly 420 to read channel circuit 402 via preamplifier 404. Preamplifier 404 is operable to amplify the minute analog signals accessed from disk platter 416. In turn, read channel circuit 402 decodes and digitizes the received analog signal to recreate the information originally written to disk platter 416. This data is provided as read data 422 to a receiving circuit. As part of decoding the received information, read channel circuit 402 processes the received signal using an oversampled data processing circuit with multiple detectors. Such an oversampled data processing circuit with multiple detectors may be implemented consistent with that disclosed above in relation to FIGS. 1-2. In some cases, the filtering may be performed consistent with the flow diagram disclosed above in relation to FIG. 3. A write operation is substantially the opposite of the preceding read operation with write data 424 being provided to read channel circuit 402. This data is then encoded and written to disk platter 416.

It should be noted that storage system 400 may be integrated into a larger storage system such as, for example, a RAID (redundant array of inexpensive disks or redundant array of independent disks) based storage system. It should also be noted that various functions or blocks of storage system 400 may be implemented in either software or firmware, while other functions or blocks are implemented in hardware.

Figure 5:
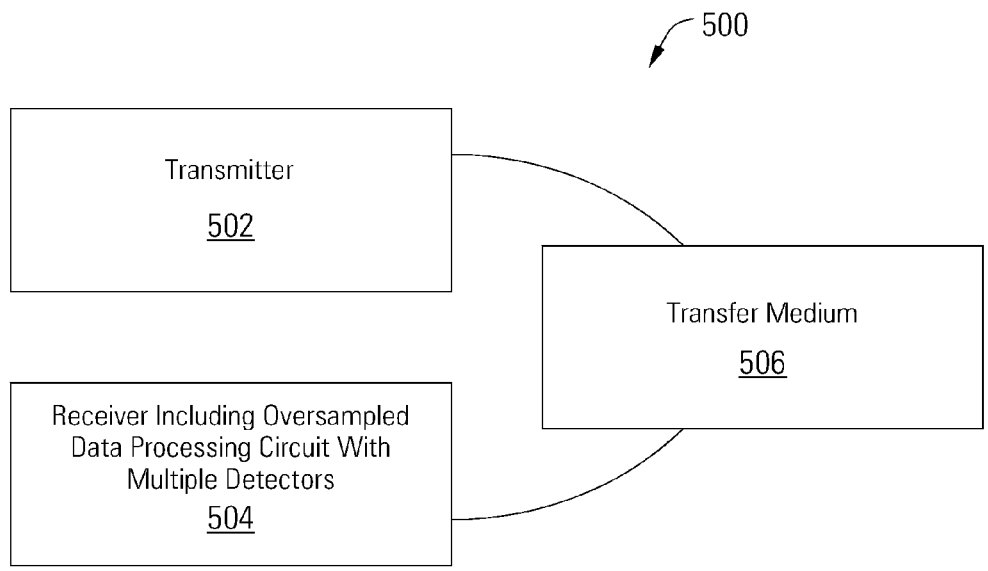
FIG. 5 depicts a wireless communication system including an oversampled data processing circuit with multiple detectors in accordance with some embodiments of the present invention.

Turning to FIG. 5, a wireless communication system 500 or data transmission device including a receiver 504 with an oversampled data processing circuit with multiple detectors is shown in accordance with some embodiments of the present invention. Communication system 500 includes a transmitter 502 that is operable to transmit encoded information via a transfer medium 506 as is known in the art. The encoded data is received from transfer medium 506 by receiver 504. Receiver 504 incorporates an oversampled data processing circuit with multiple detectors. Such an oversampled data processing circuit with multiple detectors may be implemented consistent with that described above in relation to FIGS. 1-2. In some cases, the analog to digital conversion may be done consistent with the flow diagram discussed above in relation to FIG. 3.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses and methods for processing data in an oversampled data processing circuit with multiple detectors. While detailed descriptions of one or more embodiments of the invention have been given above, various alternatives, modi-

What is claimed is:

1. An apparatus for processing data, comprising:
   a first analog to digital converter operable to sample a continuous signal at a first sampling phase to yield a first digital output;
   a second analog to digital converter operable to sample the continuous signal at a second sampling phase to yield a second digital output, wherein the second sampling phase is different from the first sampling phase;
   a first detector operable to process the first digital output to yield a first detector output; and
   a second detector operable to process the second digital output and the first detector output to yield a detected output.

2. The apparatus of claim 1, wherein the first detector output comprises log likelihood ratio values for the first digital output.

3. The apparatus of claim 2, wherein the second detector is operable to add the log likelihood ratio values to branch metric values computed in the second detector based on the second digital output.

4. The apparatus of claim 3, wherein the second detector is further operable to multiply the log likelihood ratio values by a sign of each data bit corresponding to the log likelihood ratio values before adding the log likelihood ratio values to the branch metric values.

5. The apparatus of claim 1, wherein at least one of the first detector and the second detector comprises a maximum a posteriori detector.

6. The apparatus of claim 1, further comprising a scaling circuit operable to scale the first detector output before it is processed by the second detector.

7. The apparatus of claim 1, further comprising a first digital finite impulse response filter connected between the first analog to digital converter and the first detector, operable to equalize the first digital output, and a second digital finite impulse response filter connected between the second analog to digital converter and the second detector, operable to equalize the second digital output.

8. The apparatus of claim 1, wherein the first analog to digital converter and the second analog to digital converter are operable to oversample the continuous signal at a rate at least twice that of a baud rate of the continuous signal.

9. The apparatus of claim 1, further comprising a first low pass filter connected between the first analog to digital converter and the first detector, operable to filter the first digital output, and a second low pass filter connected between the second analog to digital converter and the second detector, operable to filter the second digital output.

10. The apparatus of claim 1, further comprising an analog front end operable to process the continuous signal before it is sampled by the first analog to digital converter and the second analog to digital converter.

11. The apparatus of claim 1, further comprising:
    a third analog to digital converter operable to sample the continuous signal at a third sampling phase to yield a third digital output, wherein the first sampling phase, second sampling phase and third sampling phase are all different; and
    a third detector operable to process the third digital output to yield a third detector output, wherein the second detector is operable to process the third detector output with the second digital output and the first detector output to yield the detected output.

12. The apparatus of claim 1, wherein the first analog to digital converter, the second analog to digital converter, the first detector and the second detector are implemented as an integrated circuit.

13. The apparatus of claim 1, wherein the first analog to digital converter, the second analog to digital converter, the first detector and the second detector are incorporated in a storage device.

14. The apparatus of claim 1, wherein first analog to digital converter, the second analog to digital converter, the first detector and the second detector are incorporated in a data transmission device.

15. A method for processing data in a data processing circuit a signal, comprising:
    sampling an analog signal in a first analog to digital converter with a first sampling phase to yield a first baud rate stream;
    sampling the analog signal in a second analog to digital converter with a second sampling phase to yield a second baud rate stream;
    processing the first baud rate stream in a detector to yield log likelihood ratio values for the first baud rate stream; and
    combining values derived from the log likelihood ratio values with branch metrics in a second detector to yield a detected output.

16. The method of claim 15, further comprising scaling the log likelihood ratio values to yield the values derived from the log likelihood ratio values.

17. The method of claim 16, further comprising multiplying the log likelihood ratio values by data bit signs to yield the values derived from the log likelihood ratio values.

18. The method of claim 15, wherein combining values comprises adding the values derived from the log likelihood ratio values with the branch metrics in the second detector.

19. A storage system comprising:
    a storage medium maintaining a data set;
    a read/write head assembly operable to sense the data set on the storage medium and to provide an analog output corresponding to the data set;
    a first analog to digital converter operable to sample a continuous signal at a first sampling phase to yield a first digital output;
    a second analog to digital converter operable to sample the continuous signal at a second sampling phase to yield a second digital output, wherein the second sampling phase is different from the first sampling phase;
    a first detector operable to process the first digital output to yield log likelihood ratio values for the first digital output; and
    a second detector operable to process the second digital output to yield branch metric values for the second digital output, to add the log likelihood ratios values to the branch metric values to yield time diverse branch metrics, and to generate a detected output based on the time diverse branch metrics.

20. The storage system of claim 19, wherein the first analog to digital converter and the second analog to digital converter are operable to oversample the continuous signal at a rate at least twice that of a baud rate of the continuous signal.

* * * * *